(12) United States Patent
Majumdar et al.

(10) Patent No.: US 7,438,832 B2
(45) Date of Patent: Oct. 21, 2008

(54) IONIC LIQUID AND ELECTRONICALLY CONDUCTIVE POLYMER MIXTURES

(75) Inventors: Debasis Majumdar, Rochester, NY (US); Lee W. Tutt, Webster, NY (US); Glen C. Irvin, Jr., Rochester, NY (US); Gary S. Freedman, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 308 days.

(21) Appl. No.: 11/092,301

(22) Filed: Mar. 29, 2005

(65) Prior Publication Data

US 2006/0226396 A1    Oct. 12, 2006

(51) Int. Cl.
    *H01B 1/12*    (2006.01)
    *B05D 5/12*    (2006.01)
(52) U.S. Cl. .......................................... 252/500; 427/58
(58) Field of Classification Search .................. 252/500
    See application file for complete search history.

(56) References Cited

U.S. PATENT DOCUMENTS

| | | | |
|---|---|---|---|
| 4,070,189 A | 1/1978 | Kelley et al. |
| 4,731,408 A | 3/1988 | Jasne |
| 4,987,042 A | 1/1991 | Jonas et al. |
| 5,093,439 A | 3/1992 | Epstein et al. |
| 5,300,575 A | 4/1994 | Jonas et al. |
| 5,312,681 A | 5/1994 | Muys et al. |
| 5,354,613 A | 10/1994 | Quintens et al. |
| 5,370,981 A | 12/1994 | Krafft et al. |
| 5,372,924 A | 12/1994 | Quintens et al. |
| 5,391,472 A | 2/1995 | Muys et al. |
| 5,403,467 A | 4/1995 | Jonas et al. |
| 5,443,944 A | 8/1995 | Krafft et al. |
| 5,561,030 A | 10/1996 | Holdcroft et al. |
| 5,575,898 A | 11/1996 | Wolf et al. |
| 5,665,498 A | 9/1997 | Savage et al. |
| 5,674,654 A | 10/1997 | Zumbulyadis et al. |
| 5,716,550 A | 2/1998 | Gardner et al. |
| 5,738,934 A | 4/1998 | Jones |
| 5,766,515 A | 6/1998 | Jonas et al. |
| 5,828,432 A | 10/1998 | Shashidhar et al. |
| 5,959,708 A | 9/1999 | Lee et al. |
| 5,976,274 A | 11/1999 | Inoue et al. |
| 5,976,284 A | 11/1999 | Calvert et al. |
| 6,045,977 A | 4/2000 | Chandross et al. |
| 6,083,635 A | 7/2000 | Jonas et al. |
| 6,096,491 A | 8/2000 | Majumdar et al. |

(Continued)

FOREIGN PATENT DOCUMENTS

EP    0 615 256    9/1998

(Continued)

OTHER PUBLICATIONS

Bicak, N. "A New Ionic Liquid", Journal of Molecular Liquids 116(2005) 15-18.*

(Continued)

*Primary Examiner*—Mark Kopec
(74) *Attorney, Agent, or Firm*—Andrew J. Anderson (57) ABSTRACT

The invention relates to a mixture comprising an ionic liquid and an electronically conductive polymer in its cationic form and a polyanion associated with the conductive polymer.

31 Claims, 4 Drawing Sheets

U.S. PATENT DOCUMENTS

| | | | |
|---|---|---|---|
| 6,124,083 A | 9/2000 | Majumdar et al. | |
| 6,190,846 B1 | 2/2001 | Majumdar et al. | |
| 6,404,120 B1 | 6/2002 | Aben et al. | |
| 6,531,270 B1 | 3/2003 | Olson et al. | |
| 6,639,637 B2 | 10/2003 | Stephenson | |
| 6,667,825 B2 * | 12/2003 | Lu et al. | 359/265 |
| 6,707,517 B2 | 3/2004 | Stephenson | |
| 6,759,587 B2 | 7/2004 | Toshima et al. | |
| 6,828,062 B2 | 12/2004 | Lu et al. | |
| 2002/0177039 A1 * | 11/2002 | Lu et al. | 429/213 |
| 2003/0008135 A1 | 1/2003 | Kawamura et al. | |
| 2003/0193042 A1 | 10/2003 | Go et al. | |
| 2006/0181835 A1 * | 8/2006 | Murakami et al. | 361/503 |

FOREIGN PATENT DOCUMENTS

| | | | |
|---|---|---|---|
| EP | 1 079 397 | | 2/2001 |
| EP | 1 054 414 | | 3/2003 |
| EP | 1 324 124 | | 7/2003 |
| EP | 0 996 599 | | 8/2004 |
| WO | WO 97/18944 | | 5/1997 |
| WO | WO 02/063073 | | 8/2002 |
| WO | WO 2005/012599 | * | 2/2005 |
| WO | WO 2006/049074 | | 5/2006 |

OTHER PUBLICATIONS

Lu et al "Use of Ionic Liquids for pi-conjugated Polymer Electrodhemical Device", Science vol. 297 Aug. 9, 2002 (pp. 983-987).*

Gao et al "Aqueous/Ionic liquid interfacial polymerization for preparing polyaniline nanoparticles", Polymer (2004), 45(9), 3017-3019.*

Pringle et al "Conducting polymers with fibrillar morphology synthesized in a biphasic ionic liquid/water system", Macromolecules, (2007), 40(8), 2702-2711.*

Research Disclosure No. 41548, *Research Disclosure*, Nov. 1998, p. 1473, Kenneth Mason Publications Ltd., Hampshire, England.

* cited by examiner

IONIC LIQUID AND ELECTRONICALLY CONDUCTIVE POLYMER MIXTURES

FIELD OF THE INVENTION

The invention relates to a mixture comprising an ionic liquid and an electronically conductive polymer.

BACKGROUND OF THE INVENTION

Transparent electrically-conductive layers (TCL) of metal oxides such as indium tin oxide (ITO), antimony doped tin oxide, and cadmium stannate (cadmium tin oxide) are commonly used in the manufacture of electrooptical display devices such as liquid crystal display devices (LCDs), electroluminescent display devices, photocells, solid-state image sensors, electrochromic windows and the like.

Devices such as flat panel displays, typically contain a substrate provided with an indium tin oxide (ITO) layer as a transparent electrode. The coating of ITO is carried out by vacuum sputtering methods which involve high substrate temperature conditions up to 250° C., and therefore, glass substrates are generally used. The high cost of the fabrication methods and the low flexibility of such electrodes, due to the brittleness of the inorganic ITO layer as well as the glass substrate, limit the range of potential applications. As a result, there is a growing interest in making all-organic devices, comprising plastic resins as a flexible substrate and organic electroconductive polymer layers as an electrode. Such plastic electronics allow low cost devices with new properties. Flexible plastic substrates can be provided with an electroconductive polymer layer by continuous hopper or roller coating methods (compared to batch process such as sputtering) and the resulting organic electrodes enable the "roll to roll" fabrication of electronic devices which are more flexible, lower cost, and lower weight.

Electronically conductive polymers have received attention from various industries because of their electronic conductivity. Although many of these polymers are highly colored and are less suited for TCL applications, some of these electronically conductive polymers, such as substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408) and substituted or unsubstituted aniline-containing polymers (as mentioned in U.S. Pat. Nos. 5,716,550, 5,093,439, and 4,070,189) are transparent and not prohibitively colored, at least when coated in thin layers at moderate coverage. Because of their electronic conductivity these polymers can provide excellent process-surviving, humidity independent antistatic characteristics when coated on plastic substrates used for photographic imaging applications (vide, for example, U.S. Pat. Nos. 6,096,491; 6,124,083; 6,190,846)

U.S. Pat. No. 5,300,575 describes a method for preparing polythiophene in an aqueous medium by oxidative polymerization of a suitable monomer in the presence of a polyanion. In U.S. Pat. Nos. 5,766,515 and 6,083,635, it has been disclosed that highly conductive layers of polythiophene can be obtained, when aqueous coating compositions of polythiophene and compounds containing a di- or polyhydroxy and/or a carboxyl group, amide or lactam group are coated on suitable substrates and annealed at high temperature. Although the addition of such conductivity enhancing agents (CEAs) can generate high conductivity polythiophene coatings, manufacturing of such coatings at large scale may require coating facilities with provision for handling volatile organic compounds (VOCs). Additionally, the high temperature annealing of these coatings may not be suitable for some flexible polymeric supports.

Coated layers of organic electroconductive polymers can be patterned into electrode arrays using different methods. The known wet-etching microlithography technique is described in WO97/18944 and U.S. Pat. No. 5,976,274 wherein a positive or negative photoresist is applied on top of a coated layer of an organic electroconductive polymer, and after the steps of selectively exposing the photoresist to UV light, developing the photoresist, etching the electroconductive polymer layer and finally stripping the non-developed photoresist, a patterned layer is obtained. In U.S. Pat. No. 5,561,030 a similar method is used to form the pattern except that the pattern is formed in a continuous layer of prepolymer which is not yet conductive and that after washing the mask away the remaining prepolymer is rendered conductive by oxidation. Such methods that involve conventional lithographic techniques are cumbersome as they involve many steps and require the use of hazardous chemicals.

EP-A-615 256 describes a method to produce a pattern of a conductive polymer on a substrate that involves coating and drying a composition containing 3,4-ethylenedioxythiophene monomer, an oxidation agent, and a base; exposing the dried layer to UV radiation through a mask; and then heating. The UV exposed areas of the coating comprise non-conductive polymer and the unexposed areas comprise conductive polymer. The formation of a conductive polymer pattern in accordance with this method does not require the coating and patterning of a separate photoresist layer.

U.S. Pat. No. 6,045,977 describes a process for patterning conductive polyaniline layers containing a photobase generator. UV exposure of such layers produces a base that reduces the conductivity in the exposed areas.

EP-A-1 054 414 describes a method to pattern a conductive polymer layer by printing an electrode pattern onto said conductive polymer layer using a printing solution containing an oxidant selected from the group $ClO^-$, $BrO^-$, $MnO_4^-$, $Cr_2O_7^{-2}$, $S_2O_8^{-2}$, and $H_2O_2$. The areas of the conductive layer exposed to the oxidant solution are rendered nonconductive.

Research Disclosure, November 1998, page 1473 (disclosure no. 41548) describes various means to form patterns in conducting polymer, including photoablation wherein the selected areas are removed from the substrate by laser irradiation. Such photoablation processes are convenient, dry, one-step methods but the generation of debris may require a wet cleaning step and may contaminate the optics and mechanics of the laser device. Prior art methods involving removal of the electroconductive polymer to form the electrode pattern also induce a difference of the optical density between electroconductive and non-conductive areas of the patterned surface, which should be avoided.

Methods of patterning organic electroconductive polymer layers by image-wise heating by means of a laser have been disclosed in EP 1 079 397 A1. That method induces about a 10 to 1000 fold decrease in resistivity without substantially ablating or destroying the layer.

The application of electronically conductive polymers in display related devices has been envisioned in the past. EP 0 996 599 B1 describes a light transmissive substrate having a light transmissive conductive polymer coating for use in a touch screen coating on a CRT or LCD display screen. U.S. Pat. No. 5,738,934 describes touch screen cover sheets having a conductive polymer coating.

U.S. Pat. Nos. 5,828,432 and 5,976,284 describe conductive polymer layers employed in liquid crystal display devices. The example conductive layers are highly conductive but typically have transparency of 60% or less.

Use of polythiophene as transparent field spreading layers in displays comprising polymer dispersed liquid crystals has been disclosed in U.S. Pat. Nos. 6,639,637 and 6,707,517. However, the polythiophene layers in these patents are nonconductive in nature.

Use of conductive high molecular film for preventing the fringe field in the in-plane switching mode in liquid crystal display has been proposed in U.S. Pat. No. 5,959,708. However, the conductivity requirement for these films appears to be not very stringent. For example, in one embodiment (col. 5, lines 6-10) the high molecular film can be totally nonconductive. Moreover, U.S. Pat. No. 5,959,708 does not refer to any specification involving transmission characteristics of these films.

Use of transparent coating on glass substrates for cathode ray tubes using polythiophene and silicon oxide composites has been disclosed in U.S. Pat. No. 6,404,120. However, the method suggests in-situ polymerization of an ethylenedioxythiohene monomer on glass, baking it at an elevated temperature and subsequent washing with tetra ethyl orthosilicate. Such an involved process may be difficult to practice for roll-to-roll production of a wide flexible plastic substrate.

Use of in-situ polymerized polythiophene and polypyrrole has been proposed in U.S. Pat Appl. Pub. 2003/0008135 A1 as conductive films, for ITO replacement. As mentioned earlier, such processes are difficult to implement for roll-to-roll production of conductive coatings. In the same patent application, a comparative example was created using a dispersion of poly(3,4ethylene dioxythiophene)/polystyrene sulfonic acid which resulted in inferior coating properties.

Recently, U.S. Pat. Appl. Pub. 2003/0193042 A1 claims further improvement in conductivity of polythiophene through the addition of a substantial quantity of organic compounds such as phenols. But, health and safety concerns will dictate special precautionary measures, which may need to be taken, for the introduction of such compounds to a typical web manufacturing and coating site, thus possibly adding cost to the final product.

Ionic liquids have recently received considerable attention as electrolytes in various electrochemical devices. A method for preparing electroactive conjugated polymer layer from an ionic liquid that contains a monomer of the conjugated polymer has been disclosed in U.S. Pat. No. 6,667,825 B2. U.S. Pat. No. 6,828,062 B2 discloses an electrochemical device comprising a conjugated polymer electrode, a counter electrode and an ionic liquid between the two electrodes. Thermoelectric materials comprising an organic thermoelectric component and an inorganic thermoelectric component have been disclosed in U.S. Pat. No. 6,759,587 B2. The organic thermoelectric component was suggested to include polyaniline, polypyrrole, polythiophene, or derivatives thereof. The thermoelectric material of U.S. Pat. No. 6,759,587 B2 optionally comprised ionic liquid as plasticizer. However, none of the aforementioned patents suggest the use of ionic liquid as conductivity enhancing agent for electronically conductive polymers. Moreover, the inorganic thermoelectric component of U.S. Pat. No. 6,759,587 B2 are disclosed to have a particle size up to several hundreds μm, which are unsuitable for use in any transparent layer.

As indicated herein above, the art discloses a wide variety of electrically conductive TCL compositions that can be incorporated in displays. Although application of electronically conductive polymers in display related devices has been contemplated in the past, the stringent requirement of high transparency and low surface electrical resistivity demanded by modern display devices is extremely difficult to attain with electronically conductive polymers Thus, there is still a critical need in the art for electronically conductive polymers that can be coated roll-to-roll on a wide variety of substrates under typical manufacturing conditions using environmentally desirable components. In addition to providing superior electrode performance, the TCL layers also must be highly transparent, must be patternable, and be manufacturable at a reasonable cost.

PROBLEM TO BE SOLVED BY THE INVENTION

It is toward the objective of providing improved electrically conductive, highly transparent web coatable, TCL films that more effectively meet the diverse commercial needs than those of the prior art that the present invention is directed.

SUMMARY OF THE INVENTION

It is an object of the invention to provide a composition that provides enhanced conductivity for an electronically conductive polymer.

It is another object to provide an article that comprises an electronically conductive polymer with enhanced conductivity.

It is a further object to provide a method for providing such an article.

These and other objects of the invention are accomplished by providing a mixture comprising an ionic liquid and an electronically conductive polymer in its cationic form and a polyanion associated with the conductive polymer.

ADVANTAGEOUS EFFECT OF THE INVENTION

It was discovered that the addition of ionic liquid to a composition comprising electronically conductive polymer could significantly increase its conductivity.

DETAILED DESCRIPTION OF THE INVENTION

This invention has numerous advantages. When a mixture of ionic liquid and electronically conductive polymer is coated on a suitable substrate, the coated layer provides low "sheet resistance" or surface electrical resistivity (SER) and high visual light transmission. Such conductive and transparent layers are highly desirable for application in display products. The invention provides conductivity enhancement of electronically conductive polymers by the incorporation of ionic liquids, which have very low vapor pressure. Thus, the invention provides an alternative to prior art conductivity enhancing agents which typically are volatile organic compounds (VOCs). Large scale coating of such prior art compositions require coating facilities with provision for handling VOCs. Additionally, the present invention obviates any need for high temperature annealing of the coated layers in order to obtain high conductivity, as was required by prior art. Thus, a wide variety of substrates that cannot withstand high temperature annealing can now be utilized in the practice of the present invention. In general, the invention provides an environmentally attractive composition that can be coated on a wide variety of flexible substrates under high speed in a wide roll format providing highly conductive and transparent coatings with broad application. These and other advantages will be apparent from the detailed description below.

The electronically conductive polymer of the invention can comprise any of the known electronically conductive polymers, such as those with a conjugated backbone. These electronically conductive polymers include substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408) and substituted or unsubstituted aniline-containing polymers (as mentioned in U.S. Pat. Nos. 5,716,550, 5,093,439, and 4,070,189). Substituent groups are typically incorporated to control conductivity, morphology, stability, ease of synthesis, solubility, dispersibility and/or other functionalities. Suitable substituent groups(s) can be selected from those known in the art including but not limited to an alkyl group, an alkenyl group, an alkoxy group, a cycloalkyl group, a cycloalkenyl group, an alkanoyl group, an alkylthio group, an aryloxy group, an alkylthioalkyl group, an alkylaryl group, an arylalkyl group, an alkylsulfinyl group, an alkoxyalkyl group, an alkylsulfonyl group, an aryl group, an arylthio group, an arylsulfinyl group, an alkoxycarbonyl group, an aryloxycarbonyl group, an arylsulfonyl group, carboxy, halo or cyano, or any two groups, taken together, are an alkylene group or alkenylene group completing a 3- to 7-membered aromatic or alicyclic ring fused to a central ring of the conjugated monomer, and having carbon, nitrogen, sulfur or oxygen atoms or a sulfinyl group. Such substituent groups are disclosed in detail in U.S. Pat. No. 5,716,550.

Particularly suitable electronically conductive polymers are those, which comprise an electronically conductive polymer in its cationic form and a polyanion, since such a combination can be formulated in aqueous medium and hence environmentally desirable. Examples of such polymers are disclosed in U.S. Pat. Nos. 5,665,498 and 5,674,654 for pyrrole-containing polymers and U.S. Pat. No. 5,300,575 for thiophene-containing polymers. Among these, the thiophene-containing polymers are most preferred because of their light and heat stability, dispersion stability and ease of storage and handling.

Preparation of the aforementioned thiophene based polymers has been discussed in detail in a publication titled "Poly (3,4-ethylenedioxythiophene) and its derivatives: past, present and future" by L. B. Groenendaal, F. Jonas, D. Freitag, H. Pielartzik and J. R. Reynolds in Advanced Materials, (2000), 12, No. 7, pp. 481-494, and references therein.

In a preferred embodiment, the electronically conductive polymer is a mixture comprising:

a) a polythiophene according to Formula I in a cationic form, wherein each of R1 and R2 independently represents hydrogen or a C1-4 alkyl group or together represent an optionally substituted C1-4 alkylene group or a cycloalkylene group, preferably an ethylene group, an optionally alkyl-substituted methylene group, an optionally C1-12 alkyl- or phenyl-substituted 1,2-ethylene group, a 1,3-propylene group or a 1,2-cyclohexylene group; and n is 3 to 1000;

and b) a polyanion compound associated with it;

It is preferred that the electronically conductive polymer and polyanion combination is soluble or dispersible in organic solvents or water or mixtures thereof. For environmental reasons, aqueous systems are preferred. Polyanions used with these electronically conductive polymers include the anions of polymeric carboxylic acids such as polyacrylic acids, poly(methacrylic acid), and poly(maleic acid), and polymeric sulfonic acids such as polystyrenesulfonic acids and polyvinylsulfonic acids, the polymeric sulfonic acids being preferred for use in this invention because of its stability and availability in large scale. These polycarboxylic and polysulfonic acids may also be copolymers formed from vinylcarboxylic and vinylsulfonic acid monomers copolymerized with other polymerizable monomers such as the esters of acrylic acid and styrene. The molecular weight of the polyacids providing the polyanions preferably is 1,000 to 2,000,000 and more preferably 2,000 to 500,000. The polyacids or their alkali salts are commonly available, for example as polystyrenesulfonic acids and polyacrylic acids, or they may be produced using known methods. Instead of the free acids required for the formation of the electrically conducting polymers and polyanions, mixtures of alkali salts of polyacids and appropriate amounts of monoacids may also be used. The polythiophene to polyanion weight ratio can widely vary between 1:99 to 99:1, however, optimum properties such as high electrical conductivity and dispersion stability and coatability are obtained between 85:15 and 15:85, and more preferably between 50:50 and 15:85. The most preferred electronically conductive polymers include poly(3,4-ethylene dioxythiophene styrene sulfonate) which comprises poly(3,4-ethylene dioxythiophene) in a cationic form and polystyrenesulfonic acid.

The ionic liquid of the invention comprises a molten salt, which is liquid at room temperature and also encompasses a so-called "ambient temperature molten salt" having a melting point lower that 150° C., preferably lower than 80° C. and more preferably lower than 30° C.

Ionic liquids are compounds which consist of a cation and an anion as in a regular salt. The distinguishing characteristic is the low temperature melting point of the compound. The melting point may be below room temperature or at a relative low elevated temperature (for example 150 C) making them compatible with polymeric films, while in their liquid state. They currently fall into a few broad classes (although new classes are likely to be found and it is recognized that this list will need to be increased as more are discovered). The ionic liquids are divided into cation and anion classes, with one from each type of class necessary to construct a physical ionic liquid. The classes of cations for the compounds are: mono, di and tri-substituted imidazoliums, pyridiniums, pyrrolidiniums, phosphoniums, ammoniums, guanidiniums, and isouroniums. The classes of anions for the compounds are: halogenides, sulfates, sulfonates, amides, imides, methanes, borates, phosphates and antimonates, cobalt tetracarbonyl, trifluoroacetate, and decanoate.

The choice of cation and anion are based such that the final molecule has the appropriate melting point and that the salt has compatibility with the solvent and conductive polymer.

Electronically conductive polymer to ionic liquid weight ratio in the mixture of the invention can vary between 0.1:99.9 and 99.9:0.1. However, for some applications an excess of the ionic liquid in the mixture can cause instability and/or tackiness when coated on a substrate. In order to obtain optimum properties, the electronically conductive polymer to ionic liquid weight ratio is preferred to be between 2:98 and 20:80, and more preferred to be between 5:95 and 50:50.

In addition to the electronically conductive polymer and the ionic liquid, the mixture of the invention can comprise a suitable solvent, particularly one in which the electronically conductive polymer is soluble or dispersible. Such solvents can comprise organic solvents or water or mixtures thereof. For environmental reasons, aqueous systems are preferred. It is preferred that the mixture of the invention comprises at least 50%, more preferably between 90 and 95%, by weight of water.

The mixture of the invention can further comprise polymeric film-forming binders. Such binders can include water-soluble or water-dispersible hydrophilic polymers such as gelatin, gelatin derivatives, maleic acid or maleic anhydride copolymers, polystyrene sulfonates, cellulose derivatives (such as carboxymethyl cellulose, hydroxyethyl cellulose, cellulose acetate butyrate, diacetyl cellulose, and triacetyl cellulose), polyethylene oxide, polyvinyl alcohol, and poly-N-vinylpyrrolidone. Other suitable binders include aqueous emulsions of addition-type homopolymers and copolymers prepared from ethylenically unsaturated monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins and aqueous dispersions of polyurethanes and polyesterionomers.

The mixture of the invention can comprise other conductivity enhancing agents (CEAs), in addition to the ionic liquid. Such other CEAs can include organic compounds containing dihydroxy, poly-hydroxy, carboxyl, amide, or lactam groups, such as (1) those represented by the following Formula II:

II wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or (2) a sugar, sugar derivative, polyalkylene glycol, or glycerol compound; or (3) those selected from the group consisting of N-methylpyrrolidone, pyrrolidone, caprolactam, N-methyl caprolactam, dimethyl sulfoxide or N-octylpyrrolidone; or (4) a combination of the above.

Particularly preferred other CEAs are: sugar and sugar derivatives such as sucrose, glucose, fructose, lactose; sugar alcohols such as sorbitol, mannitol; furan derivatives such as 2-furancarboxylic acid, 3-furancarboxylic acid and alcohols. Ethylene glycol, glycerol, di- or triethylene glycol are most preferred because they provide the maximum conductivity enhancement.

Other ingredients that may be included in the mixture of the invention include but are not limited to surfactants, defoamers, coating aids, charge control agents, thickeners or viscosity modifiers, antiblocking agents, coalescing aids, crosslinking agents or hardeners, soluble and/or solid particle dyes, matte beads, inorganic or polymeric particles, adhesion promoting agents, bite solvents or chemical etchants, lubricants, plasticizers, antioxidants, colorants or tints, and other addenda that are well-known in the art. Preferred bite solvents can include any of the volatile aromatic compounds disclosed in U.S. Pat. No. 5,709,984, as "conductivity-increasing" aromatic compounds, comprising an aromatic ring substituted with at least one hydroxy group or a hydroxy substituted substituents group. These compounds include phenol, 4-chloro-3-methyl phenol, 4-chlorophenol, 2-cyanophenol, 2,6-dichlorophenol, 2-ethylphenol, resorcinol, benzyl alcohol, 3-phenyl-1-propanol, 4-methoxyphenol, 1,2-catechol, 2,4-dihydroxytoluene, 4-chloro-2-methyl phenol, 2,4-dinitrophenol, 4-chlororesorcinol, 1-naphthol, 1,3-naphthalenediol and the like. These bite solvents are particularly effective on polyester based polymer sheets. Of this group, the most preferred compounds are resorcinol and 4-chloro-3-methyl phenol. Preferred surfactants suitable for use in the invention include nonionic and anionic surfactants. Preferred crosslinking agents suitable for use in the invention include silane compounds, more preferably epoxy silane. Suitable silane compounds are disclosed in U.S. Pat. No. 5,370,981.

The mixture of the invention is typically coated on a suitable substrate to form a highly conductive and transparent layer. However, any other use of the coated layer can be envisioned within the scope of this invention. In one embodiment, the invention provides a method of forming an article comprising providing an ionic liquid, providing electronically conductive polymer, mixing said ionic liquid and electronically conductive polymer in a solvent to form a coating composition, coating said composition to form a film, and drying said film. Coating can be carried out at any temperature. However, for aqueous coating compositions, a temperature between 10° C. and 100° C. is preferred and a temperature between 20° C. and 50° C. is more preferred. Drying of the film can be carried out at any temperature depending on application. However, for flexible plastic substrates drying is preferably carried out at a temperature between 20° C. and 150° C.

The substrate on which the mixture of the invention is coated can be any rigid or flexible substrate. The substrates can be transparent, translucent or opaque, and may be colored or colorless. Rigid substrates can include glass, metal, ceramic and/or semiconductors. Flexible substrates, especially those comprising a plastic substrate, are preferred for their versatility and ease of manufacturing, coating and finishing.

The flexible plastic substrate can be any flexible self-supporting plastic film. "Plastic" means a high polymer, usually made from polymeric synthetic resins, which may be combined with other ingredients, such as curatives, fillers, reinforcing agents, colorants, and plasticizers. Plastic includes thermoplastic materials and thermosetting materials.

The flexible plastic film must have sufficient thickness and mechanical integrity so as to be self-substrating, yet should not be so thick as to be rigid. Another significant characteristic of the flexible plastic substrate material is its glass transition temperature (Tg). Tg is defined as the glass transition temperature at which plastic material will change from the glassy state to the rubbery state. It may comprise a range before the material may actually flow. Suitable materials for the flexible plastic substrate include thermoplastics of a relatively low glass transition temperature, for example up to 150° C., as well as materials of a higher glass transition temperature, for example, above 150° C. The choice of material for the flexible plastic substrate would depend on factors such as manufacturing process conditions, such as deposition temperature, and annealing temperature, as well as post-manufacturing conditions such as in a process line of a displays manufacturer. Certain of the plastic substrates discussed below can withstand higher processing temperatures of up to at least about 200° C., some up to 300°-350° C., without damage.

Typically, the flexible plastic substrate can comprise any of the following materials: polyester or polyester ionomer, polyethersulfone (PES), polycarbonate (PC), polysulfone, a phenolic resin, an epoxy resin, polyimide, polyetherester, polyetheramide, cellulose nitrate, cellulose acetate such as cellulose diacetate or cellulose triacetate, poly(vinyl acetate), polystyrene, polyolefins including polyolefin ionomers, polyamide, aliphatic polyurethanes, polyacrylonitrile, polytetrafluoroethylenes, polyvinylidene fluorides, poly(methyl (x-methacrylates), an aliphatic or cyclic polyolefin, polyarylate (PAR), polyetherimide (PEI), polyethersulphone (PES), polyimide (PI), Teflon poly(perfluoro-alboxy)fluoropolymer (PFA), poly(ether ether ketone) (PEEK), poly(ether ketone) (PEK), poly(ethylene tetrafluoroethylene)fluoropolymer (PETFE), poly(methyl methacrylate) (PMMA), various acrylate/methacrylate copolymers, natural or synthetic paper, resin-coated or laminated paper, voided polymers including polymeric foam, microvoided polymers, microporous materials, fabric, or any combinations thereof.

Aliphatic polyolefins may include high density polyethylene (HDPE), low density polyethylene (LDPE), and polypropylene, including oriented polypropylene (OPP). Cyclic polyolefins may include poly(bis(cyclopentadiene)). A preferred flexible plastic substrate is a cyclic polyolefin or a polyester. Various cyclic polyolefins are suitable for the flexible plastic substrate. Examples include Arton® made by Japan Synthetic Rubber Co., Tokyo, Japan; Zeanor T made by Zeon Chemicals L.P., Tokyo Japan; and Topas® made by Celanese A. G., Kronberg Germany. Arton is a poly(bis(cyclopentadiene)) condensate that is a film of a polymer. Alternatively, the flexible plastic substrate can be a polyester. A preferred polyester is an aromatic polyester such as Arylite. Although the substrate can be transparent, translucent or opaque, for most display applications transparent members comprising transparent substrate(s) are preferred. Although various examples of plastic substrates are set forth above, it should be appreciated that the flexible substrate can also be formed from other materials such as flexible glass and ceramic.

The flexible plastic substrate can be reinforced with a hard coating. Typically, the hard coating is an acrylic coating. Such a hard coating typically has a thickness of from 1 to 15 microns, preferably from 2 to 4 microns and can be provided by free radical polymerization, initiated either thermally or by ultraviolet radiation, of an appropriate polymerizable material. Depending on the substrate, different hard coatings can be used. When the substrate is polyester or Arton, a particularly preferred hard coating is the coating known as "Lintec." Lintec contains UV cured polyester acrylate and colloidal silica. When deposited on Arton, it has a surface composition of 35 atom % C, 45 atom % 0, and 20 atom % Si, excluding hydrogen. Another particularly preferred hard coating is the acrylic coating sold under the trademark "Terrapin" by Tekra Corporation, New Berlin, Wis.

The most preferred flexible plastic substrate is a polyester because of its superior mechanical and thermal properties as well as its availability in large quantity at a moderate price. From an optical performance perspective, polymers such as cellulose acetates are highly preferred because of their low birefringence.

The particular polyester chosen for use can be a homopolyester or a co-polyester, or mixtures thereof as desired. The polyester can be crystalline or amorphous or mixtures thereof as desired. Polyesters are normally prepared by the condensation of an organic dicarboxylic acid and an organic diol and, therefore, illustrative examples of useful polyesters will be described herein below in terms of these diol and dicarboxylic acid precursors.

Polyesters which are suitable for use in this invention are those which are derived from the condensation of aromatic, cycloaliphatic, and aliphatic diols with aliphatic, aromatic and cycloaliphatic dicarboxylic acids and may be cycloaliphatic, aliphatic or aromatic polyesters. Exemplary of useful cycloaliphatic, aliphatic and aromatic polyesters which can be utilized in the practice of their invention are poly(ethylene terephthalate), poly(cyclohexlenedimethylene), terephthalate) poly(ethylene dodecate), poly(butylene terephthalate), poly(ethylene naphthalate), poly(ethylene(2, 7-naphthalate)), poly(methaphenylene isophthalate), poly(glycolic acid), poly(ethylene succinate), poly(ethylene adipate), poly(ethylene sebacate), poly(decamethylene azelate), poly(ethylene sebacate), poly(decamethylene adipate), poly (decamethylene sebacate), poly(dimethylpropiolactone), poly(parahydroxybenzoate) (Ekonol), poly(ethylene oxybenzoate) (A-tell), poly(ethylene isophthalate), poly(tetramethylene terephthalate, poly(hexamethylene terephthalate), poly(decamethylene terephthalate), poly(1,4-cyclohexane dimethylene terephthalate) (trans), poly(ethylene 1,5-naphthalate), poly(ethylene 2,6-naphthalate), poly(1,4-cyclohexylene dimethylene terephthalate), (Kodel) (cis), and poly (1,4-cyclohexylene dimethylene terephthalate (Kodel) (trans).

Polyester compounds prepared from the condensation of a diol and an aromatic dicarboxylic acid is preferred for use in this invention. Illustrative of such useful aromatic carboxylic acids are terephthalic acid, isophthalic acid and an α-phthalic acid, 1,3-napthalenedicarboxylic acid, 1,4napthalenedicarboxylic acid, 2,6-napthalenedicarboxylic acid, 2,7-napthalenedicarboxylic acid, 4,4'-diphenyldicarboxylic acid, 4,4'-diphenysulfphone-dicarboxylic acid, 1,1,3-trimethyl-5-carboxy-3-(p-carboxyphenyl)-idane, diphenyl ether 4,4'-dicarboxylic acid, bis-p(carboxy-phenyl)methane, and the like. Of the aromatic dicarboxylic acids, those based on a benzene ring (such as terephthalic acid, isophthalic acid, orthophthalic acid) are preferred for use in the practice of this invention. Amongst these preferred acid precursors, terephthalic acid is particularly preferred acid precursor.

Preferred polyesters for use in the practice of this invention include poly(ethylene terephthalate), poly(butylene terephthalate), poly(1,4-cyclohexylene dimethylene terephthalate) and poly(ethylene naphthalate) and copolymers and/or mixtures thereof. Among these polyesters of choice, poly(ethylene terephthalate) is most preferred.

Most preferred cellulose acetate for use in the present invention is cellulose triacetate, also known as triacetylcellulose or TAC. TAC film has traditionally been used by the photographic industry due to its unique physical properties, and flame retardance. TAC film is also the preferred polymer film for use as a cover sheet for polarizers used in liquid crystal displays.

The manufacture of TAC films by a casting process is well known and includes the following process. A TAC solution in organic solvent (dope) is typically cast on a drum or a band, and the solvent is evaporated to form a film. Before casting the dope, the concentration of the dope is typically so adjusted that the solid content of the dope is in the range of 18 to 35 wt. %. The surface of the drum or band is typically polished to give a mirror plane. The casting and drying stages of the solvent cast methods are described in U.S. Pat. Nos. 2,336,310, 2,367,603, 2,492,078, 2,492,977, 2,492,978, 2,607,704, 2,739,069, 2,739,070, British Patent Nos. 640,731, 736,892, Japanese Patent Publication Nos. 45(1970)-4554, 49(1974)-5614, Japanese Patent Provisional Publication Nos. 60(1985)-176834, 60(1985)-203430 and 62(1987)-115035.

A plasticizer can be added to the cellulose acetate film to improve the mechanical strength of the film. The plasticizer has another function of shortening the time for the drying process. Phosphoric esters and carboxylic esters (such as phthalic esters and citric esters) are usually used as the plasticizer. Examples of the phosphoric esters include triphenyl phosphate (TPP) and tricresyl phosphate (TCP). Examples of the phthalic esters include dimethyl phthalate (DMP), diethyl phthalate (DEP), dibutyl phthalate (DBP), dioctyl phthalate (DOP), diphenyl phthalate (DPP) and diethylhexyl phthalate (DEHP). Examples of the citric esters include o-acetyltriethyl citrate (OACTE) and o-acetyltributyl citrate (OACTB). The amount of the plasticizer is in the range of typically 0.1 to 25 wt. %, conveniently 1 to 20 wt. %, desirably 3 to 15 wt. % based on the amount of cellulose acetate.

The aforesaid substrate useful for application in display devices can be planar and/or curved. The curvature of the substrate can be characterized by a radius of curvature, which may have any value. Alternatively, the substrate may be bent so as to form an angle. This angle may be any angle from 0° to 360°, including all angles therebetween and all ranges therebetween. If the substrate is electrically conducting, an insulating material such as a non-conductive polymer may be placed between the substrate and the conducting polymer.

The substrate may be of any thickness, such as, for example. $10^{-8}$ cm to 1 cm including all values in between and all ranges therebetween. Thicker and thinner layers may be used. The substrate need not have a uniform thickness. The preferred shape is square or rectangular, although any shape may be used. Before the substrate is coated with the conducting polymer it may be physically and/or optically patterned, for example by rubbing, by the application of an image, by the application of patterned electrical contact areas, by the presence of one or more colors in distinct regions, by embossing, microembossing, microreplication, etc.

The aforesaid substrate can comprise a single layer or multiple layers according to need. The multiplicity of layers may include any number of auxiliary layers such as antistatic layers, tie layers or adhesion promoting layers, abrasion resistant layers, curl control layers, conveyance layers, barrier layers, splice providing layers, UV absorption layers, optical effect providing layers, such as antireflective and antiglare layers, waterproofing layers, adhesive layers, imaging layers and the like.

The polymer substrate can be formed by any method known in the art such as those involving extrusion, coextrusion, quenching, orientation, heat setting, lamination, coating and solvent casting. For some applications, it is preferred that the polymer substrate is an oriented sheet formed by any suitable method known in the art, such as by a flat sheet process or a bubble or tubular process. The flat sheet process involves extruding or coextruding the materials of the sheet through a slit die and rapidly quenching the extruded or coextruded web upon a chilled casting drum so that the polymeric component(s) of the sheet are quenched below their solidification temperature.

The quenched sheet is then biaxially oriented by stretching in mutually perpendicular directions at a temperature above the glass transition temperature of the polymer(s). The sheet may be stretched in one direction and then in a second direction or may be simultaneously stretched in both directions. The preferred stretch ratio in any direction is at least 3:1. After the sheet has been stretched, it is heat set by heating to a temperature sufficient to crystallize the polymers while restraining to some degree the sheet against retraction in both directions of stretching.

The polymer sheet may be subjected to any number of coatings and treatments, after extrusion, coextrusion, orientation, etc. or between casting and full orientation, to improve its properties, such as printability, barrier properties, heat-sealability, spliceability, adhesion to other substrates and/or imaging layers. Examples of such coatings can be acrylic coatings for printability, polyvinylidene halide for heat seal properties, etc. Examples of such treatments can be flame, plasma and corona discharge treatment, ultraviolet radiation treatment, ozone treatment and electron beam treatment to improve coatability and adhesion. Further examples of treatments can be calendaring, embossing and patterning to obtain specific effects on the surface of the web. The polymer sheet can be further incorporated in any other suitable substrate by lamination, adhesion, cold or heat sealing, extrusion coating, or any other method known in the art.

The mixture of the invention can be coated by any method known in the art. Particularly preferred methods include coating from a suitable coating composition by any well known coating method such as air knife coating, gravure coating, hopper coating, roller coating, spray coating, electrochemical coating, inkjet printing, flexographic printing, and the like. Altlernatively, the layer coated from the mixture of the invention can be transferred to a receiver member from a donor member by the application of heat and/or pressure. An adhesive layer may be present between the layer and the receiver member. Such methods of transfer are discussed in detail in U.S. patent application Ser. No. 10/969,889 filed Oct. 21, 2004 and Ser. No. 11/022,155 filed Dec. 22, 2004.

Other preferred method of forming the conductive layer utilizing the invention material is by thermal transfer as disclosed in a series of U.S. patents and patent applications, e.g., U.S. Pat. Nos. 6,114,088; 6,140,009; 6,214,520; 6,221,553; 6,582,876; 6,586,153 by Wolk et al.; U.S. Pat. Nos. 6,610,455; 6,582,875; 6,252,621; 2004/0029039 A1; by Tutt et al., U.S. Pat. No. 5,171,650 by Ellis et al.; 2004/0065970 A1 by Blanchet-Fincher. Accordingly, it is envisioned that a multilayer transfer unit can be formed on a donor sheet wherein at least one of the layers is conductive and coated from the mixture of the invention. The conductive layer(s) can subsequently be transferred, fully or partially, onto a receiver substrate through the application of heat.

Besides the conductive layer of the invention, the aforementioned transfer unit may comprise a number of other layers. These additional layers may include radiation absorption layer, which can be a light to heat conversion layer, interlayer, release layer, adhesion promoting layer, operational layer (which is used in the operation of a device), non-operational layer (which is not used in the operation of a device but can facilitate, for example, transfer of a transfer layer, protection from damage and/or contact with outside elements).

Thermal transfer of the layer of the invention can be accomplished by the application of directed heat on a selected portion of the thermal transfer element. Heat can be generated using a heating element (e.g., a resistive heating element), converting radiation (e.g., a beam of light) to heat, and/or applying an electrical current to a layer of thermal transfer element to generate heat.

For some specific display applications, such as those involving organic or polymeric light emitting diodes the roughness of the conductive layer can be critical. Typically, a very smooth surface, with low roughness (Ra) is desired for maximizing optical and barrier properties of the coated substrate. Preferred Ra values for such applications are less than 1000 nm, more preferably less than 100 nm, and most preferably less than 20 nm. The conductive layer of the invention can easily fulfill such requirement. However, it is to be understood that if for some application a rougher surface is required higher Ra values can be attained within the scope of this invention, by any means known in the art, e.g., embossing, microreplication, incorporation of matte particles, and the like.

The SER value of the conductive layer of the invention can vary according to need. For use as an electrode in a display device, the SER is typically less than 10000 ohms/square, preferably less than 5000 ohms/square, and more preferably less than 2000 ohms/square and most preferably less than 1500 ohms/square, as per the current invention.

The transparency of the conductive layer of the invention can vary according to need. For use as an electrode in a display device, the conductive layer is desired to be highly transparent to visual light. Accordingly, it is preferred that the mixture of the invention is substantially free of any inorganic or polymeric particle larger than 1 µm, more preferably larger than 0.5 µm and most preferably larger than 0.3 µm in diameter, to avoid any undesirable light scattering from the coated layer. The visual light transmission value T for the conductive layer of the invention is preferably >65%, more preferably $\geq$70%, most preferably $\geq$80%, and optimally $\geq$90%.

The conductive layer need not form an integral whole, need not have a uniform thickness and need not be contiguous with the base substrate.

In a particular embodiment of the invention the conductive layer may be formed into electrode or other array patterns. Useful patterning techniques include: inkjet printing, transfer printing such as lithoplate printing, stamping, various dry etching methods such as laser etching and thermal ablation, wet etching methods such as the microlithographic techniques described in WO97/18944 and U.S. Pat. No. 5,976, 274, and others. Additionally, any of the transfer methods disclosed in U.S. Pat. Nos. 6,114,088; 6,140,009; 6,214,520; 6,221,553; 6,582,876; 6,586,153 by Wolk et al.; U.S. Pat. Nos. 6,610,455; 6,582,875; 6,252,621; 2004/0029039 A1; by Tutt et al., U.S. Pat. No. 5,171,650 by Ellis et al.; 2004/0065970 A1 by Blanchet-Fincher, and U.S. patent application Ser. No. 10/969,889 filed Oct. 21, 2004 and Ser. No. 11/022, 155 filed Dec. 22, 2004 can be used to pattern-wise apply the conductive layer from a donor to a receiver element.

In a particularly preferred embodiment, the conductive layer of the invention forms at least a portion of a device, most preferably a display device. The display device typically comprises at least one imageable layer wherein the imageable layer can contain an electrically imageable material. The electrically imageable material can be light emitting or light modulating. Light emitting materials can be inorganic or organic in nature. Particularly preferred are organic light emitting diodes (OLED) or polymeric light emitting diodes (PLED). The light modulating material can be reflective or transmissive. Light modulating materials can be electrochemical, electrophoretic, such as Gyricon particles, electrochromic, or liquid crystals. The liquid crystalline material can be twisted nematic (TN), super-twisted nematic (STN), ferroelectric, magnetic, or chiral nematic liquid crystals. Especially preferred are chiral nematic liquid crystals. The chiral nematic liquid crystals can be polymer dispersed liquid crystals (PDLC). Structures having stacked imaging layers or multiple substrate layers, however, are optional for providing additional advantages in some case.

Figure 1:
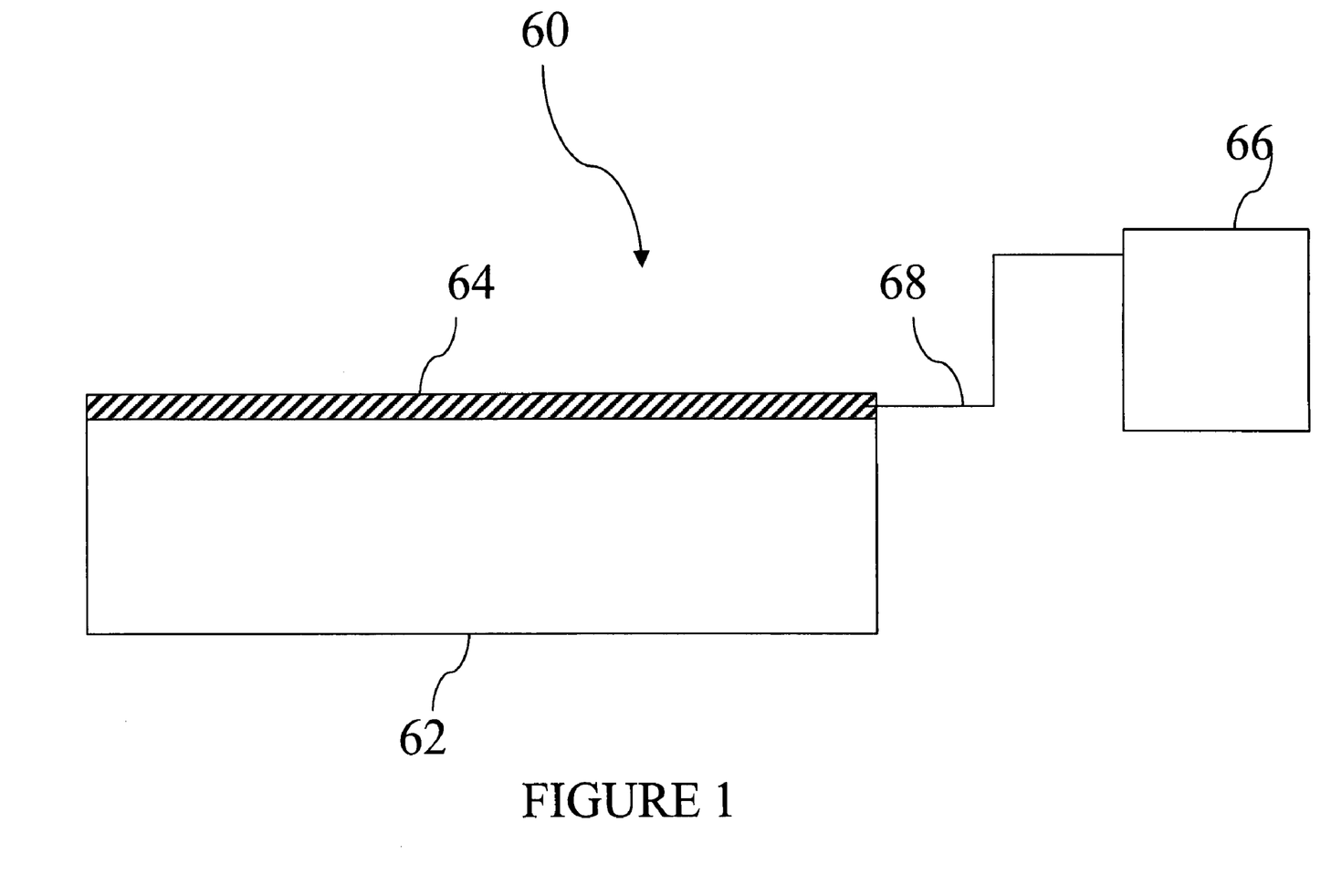
FIG. 1 shows a schematic of a conductive layer on a substrate connected to a power source by an electric lead, as per the invention.

The conductive layer may simply be incorporated in a device as any one or more conducting electrodes present in prior art devices. In some cases the conductive layer preferably has at least one electric lead attached to (in contact with) it for the application of current, voltage, etc. (i.e. electrically connected). The lead(s) is/are preferably not in electrical contact with the substrate and may be made of patterned deposited metal, conductive or semiconductive material, such as ITO, may be a simple wire in contact with the conducting polymer, and/or conductive paint comprising, for example, a conductive polymer, carbon, and/or metal particles. Such devices according to the invention preferably also include a current or a voltage source electrically connected to the conducting electrode through the lead(s). A power source, battery, etc. may be used. One embodiment of the invention is illustrated in FIG. 1 as a device component 60, wherein a conductive layer 64 has been formed on a substrate 62, and is connected to a power source 66 by means of an electric lead 68. In addition to or alternative to functioning as an electrode, the conductive layer of the invention can form any other functional layer in any device.

In a typical device, the electrically imageable material can be addressed with an electric field and then retain its image after the electric field is removed, a property typically referred to as "bistable". Particularly suitable electrically imageable materials that exhibit "bistability" are electrochemical, electrophoretic, such as Gyricon particles, electrochromic, magnetic, or chiral nematic liquid crystals. Especially preferred are chiral nematic liquid crystals. The chiral nematic liquid crystals can be polymer dispersed liquid crystals (PDLC).

For purpose of illustration, the display will be described primarily as a liquid crystal display. However, it is envisioned that the present invention may find utility in a number of other display applications.

Figure 2:
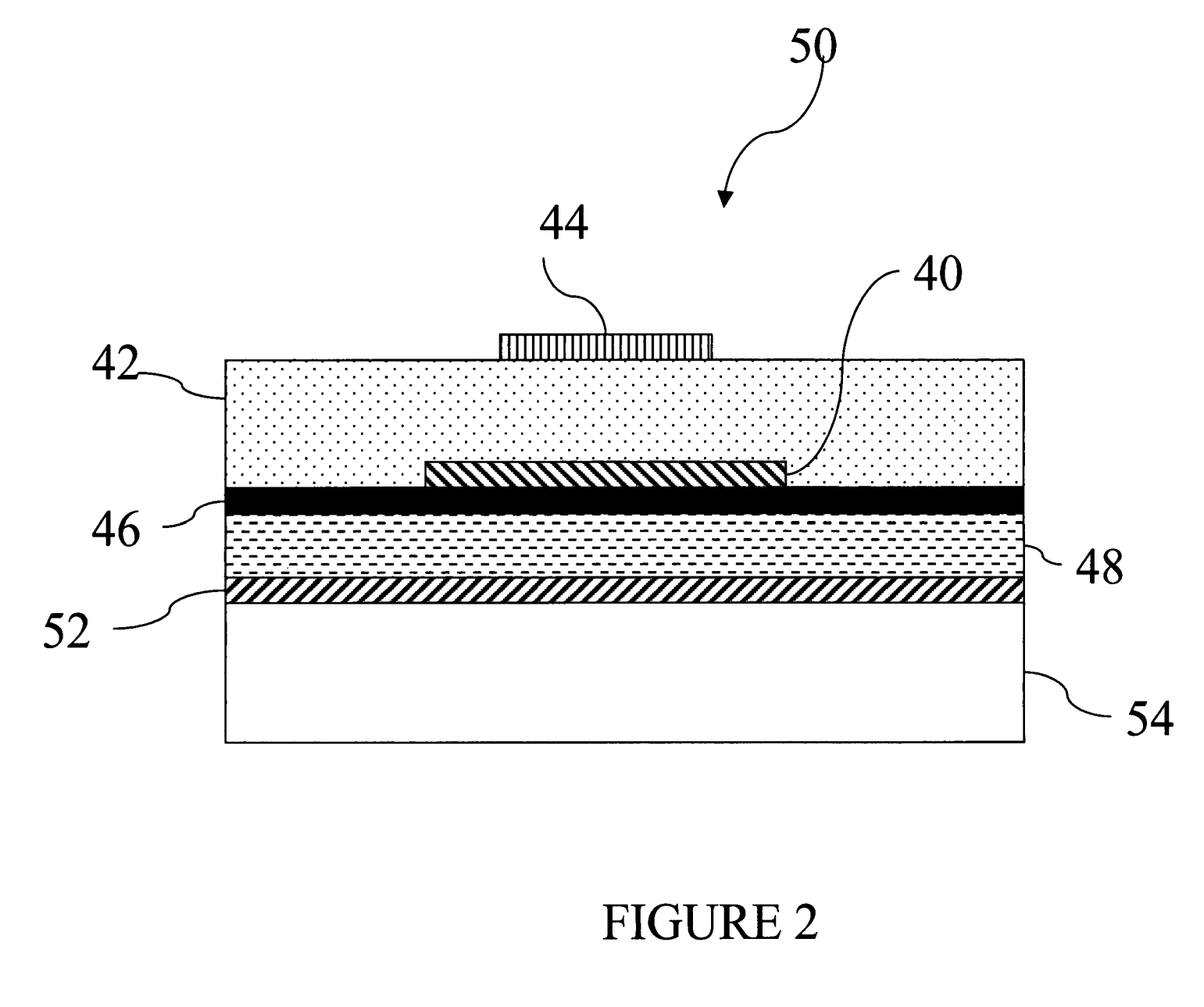
FIG. 2 shows a schematic of a polymer dispersed LC display, as per the invention.

As used herein, a "liquid crystal display" (LCD) is a type of flat panel display used in various electronic devices. At a minimum, an LCD comprises a substrate, at least one conductive layer and a liquid crystal layer. LCDs may also comprise two sheets of polarizing material with a liquid crystal solution between the polarizing sheets. The sheets of polarizing material may comprise a substrate of glass or transparent plastic. The LCD may also include functional layers. In one embodiment of an LCD item 50, illustrated in FIG. 2, a transparent, multilayer flexible substrate 54 has a first conductive layer 52, which may be patterned, onto which is coated the light-modulating liquid crystal layer 48. A second conductive layer 40 is applied and overcoated with a dielectric layer 42 to which dielectric conductive row contacts 44 are attached, including vias (not shown) that permit interconnection between conductive layers and the dielectric conductive row contacts. An optional nanopigmented layer 46 is applied between the liquid crystal layer 48 and the second conductive layer 40. The conductive layer of the invention can function as any of the aforementioned conductive layers. In a typical matrix-address light-emitting display device, numerous light-emitting devices are formed on a single substrate and arranged in groups in a regular grid pattern. Activation may be by rows and columns.

The liquid crystal (LC) is used as an optical switch. The substrates are usually manufactured with transparent, conductive electrodes, in which electrical "driving" signals are coupled. The driving signals induce an electric field which can cause a phase change or state change in the LC material, the LC exhibiting different light-reflecting characteristics according to its phase and/or state.

LC

Liquid crystals can be nematic (N), chiral nematic (N*), or smectic, depending upon the arrangement of the molecules in the mesophase. Chiral nematic liquid crystal (N*LC) displays are typically reflective, that is, no backlight is needed, and can function without the use of polarizing films or a color filter.

Chiral nematic liquid crystal refers to the type of liquid crystal having finer pitch than that of twisted nematic and super-twisted nematic used in commonly encountered LC devices. Chiral nematic liquid crystals are so named because such liquid crystal formulations are commonly obtained by adding chiral agents to host nematic liquid crystals. Chiral nematic liquid crystals may be used to produce bi-stable or multi-stable displays. These devices have significantly reduced power consumption due to their non-volatile "memory" characteristic. Since such displays do not require a continuous driving circuit to maintain an image, they consume significantly reduced power. Chiral nematic displays are bistable in the absence of a field; the two stable textures are the reflective planar texture and the weakly scattering focal conic texture. In the planar texture, the helical axes of the chiral nematic liquid crystal molecules are substantially perpendicular to the substrate upon which the liquid crystal is disposed. In the focal conic state the helical axes of the liquid crystal molecules are generally randomly oriented. Adjusting the concentration of chiral dopants in the chiral nematic material modulates the pitch length of the mesophase and, thus, the wavelength of radiation reflected. Chiral nematic materials that reflect infrared radiation and ultraviolet have been used for purposes of scientific study. Commercial displays are most often fabricated from chiral nematic materials that reflect visible light. Some known LCD devices include chemically-etched, transparent, conductive layers overlying a glass substrate as described in U.S. Pat. No. 5,667,853, incorporated herein by reference.

In one embodiment, a chiral-nematic liquid crystal composition may be dispersed in a continuous matrix. Such materials are referred to as "polymer-dispersed liquid crystal" materials or "PDLC" materials. Such materials can be made by a variety of methods. For example, Doane et al. (Applied Physics Letters, 48, 269 (1986)) disclose a PDLC comprising approximately 0.4 μm droplets of nematic liquid crystal 5CB in a polymer binder. A phase separation method is used for preparing the PDLC. A solution containing monomer and liquid crystal is filled in a display cell and the material is then polymerized. Upon polymerization the liquid crystal becomes immiscible and nucleates to form droplets. West et al. (Applied Physics Letters 63, 1471 (1993)) disclose a PDLC comprising a chiral nematic mixture in a polymer binder. Once again a phase separation method is used for preparing the PDLC. The liquid-crystal material and polymer (a hydroxy functionalized polymethylmethacrylate) along with a cross-linker for the polymer are dissolved in a common organic solvent toluene and coated on a transparent conductive layer on a substrate. A dispersion of the liquid-crystal material in the polymer binder is formed upon evaporation of toluene at high temperature. The phase separation methods of Doane et al. and West et al. require the use of organic solvents that may be objectionable in certain manufacturing environments.

The contrast of the display is degraded if there is more than a substantial monolayer of N*LC domains. The term "substantial monolayer" is defined by the Applicants to mean that, in a direction perpendicular to the plane of the display, there is no more than a single layer of domains sandwiched between the electrodes at most points of the display (or the imaging layer), preferably at 75 percent or more of the points (or area) of the display, most preferably at 90 percent or more of the points (or area) of the display. In other words, at most, only a minor portion (preferably less than 10 percent) of the points (or area) of the display has more than a single domain (two or more domains) between the electrodes in a direction perpendicular to the plane of the display, compared to the amount of points (or area) of the display at which there is only a single domain between the electrodes.

The amount of material needed for a monolayer can be accurately determined by calculation based on individual domain size, assuming a fully closed packed arrangement of domains. (In practice, there may be imperfections in which gaps occur and some unevenness due to overlapping droplets or domains.) On this basis, the calculated amount is preferably less than about 150 percent of the amount needed for monolayer domain coverage, preferably not more than about 125 percent of the amount needed for a monolayer domain coverage, more preferably not more than 110 percent of the amount needed for a monolayer of domains. Furthermore, improved viewing angle and broadband features may be obtained by appropriate choice of differently doped domains based on the geometry of the coated droplet and the Bragg reflection condition.

In one embodiment, the display device or display sheet has simply a single imaging layer of liquid crystal material along a line perpendicular to the face of the display, preferably a single layer coated on a flexible substrate. Such as structure, as compared to vertically stacked imaging layers each between opposing substrates, is especially advantageous for monochrome shelf labels and the like. Structures having stacked imaging layers, however, are optional for providing additional advantages in some case.

Preferably, the domains are flattened spheres and have on average a thickness substantially less than their length, preferably at least 50% less. More preferably, the domains on average have a thickness (depth) to length ratio of 1:2 to 1:6. The flattening of the domains can be achieved by proper formulation and sufficiently rapid drying of the coating. The domains preferably have an average diameter of 2 to 30 microns. The imaging layer preferably has a thickness of 10 to 150 microns when first coated and 2 to 20 microns when dried. The flattened domains of liquid crystal material can be defined as having a major axis and a minor axis. In a preferred embodiment of a display or display sheet, the major axis is larger in size than the cell (or imaging layer) thickness for a majority of the domains. Such a dimensional relationship is shown in U.S. Pat. No. 6,061,107.

Modern chiral nematic liquid crystal materials usually include at least one nematic host combined with a chiral dopant. In general, the nematic liquid crystal phase is composed of one or more mesogenic components combined to provide useful composite properties. Many such materials are available commercially. The nematic component of the chiral nematic liquid crystal mixture may be comprised of any suitable nematic liquid crystal mixture or composition having appropriate liquid crystal characteristics. Nematic liquid crystals suitable for use in the present invention are preferably composed of compounds of low molecular weight selected from nematic or nematogenic substances, for example from the known classes of the azoxybenzenes, benzylideneanilines, biphenyls, terphenyls, phenyl or cyclohexyl benzoates, phenyl or cyclohexyl esters of cyclohexanecarboxylic acid; phenyl or cyclohexyl esters of cyclohexylbenzoic acid; phenyl or cyclohexyl esters of cyclohexylcyclohexanecarboxylic acid; cyclohexylphenyl esters of benzoic acid, of cyclohexanecarboxyiic acid and of cyclohexylcyclohexanecarboxylic acid; phenyl cyclohexanes; cyclohexylbiphenyls; phenyl cyclohexylcyclohexanes; cyclohexylcyclohexanes; cyclohexylcyclohexenes; cyclohexylcyclohexylcyclohexenes; 1,4-bis-cyclohexylbenzenes; 4,4-bis-cyclohexylbiphenyls; phenyl- or cyclohexylpyrimidines; phenyl- or cyclohexylpyridines; phenyl- or cyclohexylpyridazines; phenyl- or cyclohexyldioxanes; phenyl- or cyclohexyl-1,3-dithianes; 1,2-diphenylethanes; 1,2-dicyclohexylethanes; 1-phenyl-2-cyclohexylethanes; 1-cyclohexyl-2-(4-phenylcyclohexyl)ethanes; 1-cyclohexyl-2',2-biphenylethanes; 1-phenyl-2-cyclohexylphenylethanes; optionally halogenated stilbenes; benzyl phenyl ethers; tolanes; substituted cinnamic acids and esters; and further classes of nematic or nematogenic substances. The 1,4-phenylene groups in these compounds may also be laterally mono- or difluorinated. The liquid crystalline material of this preferred embodiment is based on the achiral compounds of this type. The most important compounds, that are possible as components of these liquid crystalline materials, can be characterized by the following formula R'—X—Y-Z-R" wherein X and Z, which may be identical or different, are in each case, independently from one another, a bivalent radical from the group formed by -Phe-, -Cyc-, -Phe-Phe-, -Phe-Cyc-, -Cyc-Cyc-, -Pyr-, -Dio-, —B-Phe- and —B-Cyc-; wherein Phe is unsubstituted or fluorine-substituted 1,4-phenylene, Cyc is trans-1,4-cyclohexylene or 1,4-cyclohexenylene, Pyr is pyrimidine-2,5-diyl or pyridine-2,5-diyl, Dio is 1,3-dioxane-2,5-diyl, and B is 2-(trans-1,4-cyclohexyl)ethyl, pyrimidine-2,5-diyl, pyridine-2,5-diyl or 1,3-dioxane-2,5-diyl. Y in these compounds is selected from the following bivalent groups —CH=CH—, —C≡C—, —N=N(O)—, —CH=CY'—, —CH=N(O)—, —CH2-CH2-, —CO—O—, —CH2-O—, —CO—S—, —CH2-S—, —COO-Phe-COO— or a single bond, with Y' being halogen, preferably chlorine, or —CN; R' and R" are, in each case, independently of one another, alkyl, alkenyl, alkoxy, alkenyloxy, alkanoyloxy, alkoxycarbonyl or alkoxycarbonyloxy with 1 to 18, preferably 1 to 12 C atoms, or alternatively one of R' and R" is —F, —CF3, —OCF3, —Cl, —NCS or —CN. In most of these compounds R' and R' are, in each case, independently of each another, alkyl, alkenyl or alkoxy with different chain length, wherein the sum of C atoms in nematic media generally is between 2 and 9, preferably between 2 and 7. The nematic liquid crystal phases typically consist of 2 to 20, preferably 2 to 15 components. The above list of materials is not intended to be exhaustive or limiting. The lists disclose a variety of representative materials suitable for use or mixtures, which comprise the active element in electro-optic liquid crystal compositions.

Suitable chiral nematic liquid crystal compositions preferably have a positive dielectric anisotropy and include chiral material in an amount effective to form focal conic and twisted planar textures. Chiral nematic liquid crystal materials are preferred because of their excellent reflective characteristics, bi-stability and gray scale memory. The chiral nematic liquid crystal is typically a mixture of nematic liquid crystal and chiral material in an amount sufficient to produce the desired pitch length. Suitable commercial nematic liquid crystals include, for example, E7, E44, E48, E31, E80, BL087, BL101, ZLI-3308, ZLI-3273, ZLI-5048-000, ZLI-5049-100, ZLI-5100-100, ZLI-5800-000, MLC-6041-100.TL202, TL203, TL204 and TL205 manufactured by E. Merck (Darmstadt, Germany). Although nematic liquid crystals having positive dielectric anisotropy, and especially cyanobiphenyls, are preferred, virtually any nematic liquid crystal known in the art, including those having negative dielectric anisotropy should be suitable for use in the invention. Other nematic materials may also be suitable for use in the present invention as would be appreciated by those skilled in the art.

The chiral dopant added to the nematic mixture to induce the helical twisting of the mesophase, thereby allowing reflection of visible light, can be of any useful structural class. The choice of dopant depends upon several characteristics including among others its chemical compatibility with the nematic host, helical twisting power, temperature sensitivity, and light fastness. Many chiral dopant classes are known in the art: e.g., G. Gottarelli and G. Spada, Mol. Cryst. Liq. Crys., 123, 377 (1985); G. Spada and G. Proni, Enantiomer, 3, 301 (1998) and references therein. Typical well-known dopant classes include 1,1-binaphthol derivatives; isosorbide (D-1) and similar isomannide esters as disclosed in U.S. Pat. No. 6,217,792; TADDOL derivatives (D-2) as disclosed in U.S. Pat. No. 6,099,751; and the pending spiroindanes esters (D-3) as disclosed in U.S. patent application Ser. No. 10/651,692 by T. Welter et al., filed Aug. 29, 2003, titled "Chiral Compounds And Compositions Containing The Same," hereby incorporated by reference.

-continued

D-3

The pitch length of the liquid crystal materials may be adjusted based upon the following equation (1):

$$\lambda max = nav\ p0$$

where λmax is the peak reflection wavelength, that is, the wavelength at which reflectance is a maximum, nav is the average index of refraction of the liquid crystal material, and p0 is the natural pitch length of the chiral nematic helix. Definitions of chiral nematic helix and pitch length and methods of its measurement, are known to those skilled in the art such as can be found in the book, Blinov, L. M., Electro-optical and Magneto-Optical Properties of Liquid Crystals, John Wiley & Sons Ltd. 1983. The pitch length is modified by adjusting the concentration of the chiral material in the liquid crystal material. For most concentrations of chiral dopants, the pitch length induced by the dopant is inversely proportional to the concentration of the dopant. The proportionality constant is given by the following equation (2):

$$p0 = 1/(HTP.c)$$

where c is the concentration of the chiral dopant and HTP (as termed □ in some references) is the proportionality constant.

For some applications, it is desired to have LC mixtures that exhibit a strong helical twist and thereby a short pitch length. For example in liquid crystalline mixtures that are used in selectively reflecting chiral nematic displays, the pitch has to be selected such that the maximum of the wavelength reflected by the chiral nematic helix is in the range of visible light. Other possible applications are polymer films with a chiral liquid crystalline phase for optical elements, such as chiral nematic broadband polarizers, filter arrays, or chiral liquid crystalline retardation films. Among these are active and passive optical elements or color filters and liquid crystal displays, for example STN, TN, AMD-TN, temperature compensation, polymer free or polymer stabilized chiral nematic texture (PFCT, PSCT) displays. Possible display industry applications include ultralight, flexible, and inexpensive displays for notebook and desktop computers, instrument panels, video game machines, videophones, mobile phones, hand-held PCs, PDAs, e-books, camcorders, satellite navigation systems, store and supermarket pricing systems, highway signs, informational displays, smart cards, toys, and other electronic devices.

There are alternative display technologies to LCDs that may be used, for example, in flat panel displays. A notable example is organic or polymer light emitting devices (OLEDs) or (PLEDs), which are comprised of several layers in which one of the layers is comprised of an organic material that can be made to electroluminesce by applying a voltage across the device. An OLED device is typically a laminate formed in a substrate such as glass or a plastic polymer. Alternatively, a plurality of these OLED devices may be assembled such to form a solid state lighting display device.

A light emitting layer of a luminescent organic solid, as well as adjacent semiconductor layers, are sandwiched between an anode and a cathode. The semiconductor layers may be hole injecting and electron injecting layers. PLEDs may be considered a subspecies of OLEDs in which the luminescent organic material is a polymer. The light emitting layers may be selected from any of a multitude of light emitting organic solids, e.g., polymers that are suitably fluorescent or chemiluminescent organic compounds. Such compounds and polymers include metal ion salts of 8-hydroxyquinolate, trivalent metal quinolate complexes, trivalent metal bridged quinolate complexes, Schiff-based divalent metal complexes, tin (IV) metal complexes, metal acetylacetonate complexes, metal bidenate ligand complexes incorporating organic ligands, such as 2-picolylketones, 2-quinaldylketones, or 2-(o-phenoxy)pyridine ketones, bis-phosphonates, divalent metal maleonitriledithiolate complexes, molecular charge transfer complexes, rare earth mixed chelates, (5-hydroxy)quinoxaline metal complexes, aluminum tris-quinolates, and polymers such as poly(p-phenylenevinylene), poly(dialkoxyphenylenevinylene), poly(thiophene), poly(fluorene), poly(phenylene), poly(phenylacetylene), poly(aniline), poly(3-alkylthiophene), poly(3-octylthiophene), and poly(N-vinylcarbazole). When a potential difference is applied across the cathode and anode, electrons from the electron injecting layer and holes from the hole injecting layer are injected into the light emitting layer; they recombine, emitting light. OLEDs and PLEDs are described in the following U.S. patents: U.S. Pat. No. 5,707,745 to Forrest et al., U.S. Pat. No. 5,721,160 to Forrest et al., U.S. Pat. No. 5,757,026 to Forrest et al., U.S. Pat. No. 5,834,893 to Bulovic et al., U.S. Pat. No. 5,861,219 to Thompson et al., U.S. Pat. No. 5,904,916 to Tang et al., U.S. Pat. No. 5,986,401 to Thompson et al., U.S. Pat. No. 5,998,803 to Forrest et al., U.S. Pat. No. 6,013,538 to Burrows et al., U.S. Pat. No. 6,046,543 to Bulovic et al., U.S. Pat. No. 6,048,573 to Tang et al., U.S. Pat. No. 6,048,630 to Burrows et al., U.S. Pat. No. 6,066,357 to Tang et al., U.S. Pat. No. 6,125,226 to Forrest et al., U.S. Pat. No. 6,137,223 to Hung et al., U.S. Pat. No. 6,242,115 to Thompson et al., and U.S. Pat. No. 6,274,980 to Burrows et al.

In a typical matrix address light emitting display device, numerous light emitting devices are formed on a single substrate and arranged in groups in a regular grid pattern. Activation may be by rows and columns, or in an active matrix with individual cathode and anode paths. OLEDs are often manufactured by first depositing a transparent electrode on the substrate, and patterning the same into electrode portions. The organic layer(s) is then deposited over the transparent electrode. A metallic electrode may be formed over the organic layers. For example, in U.S. Pat. No. 5,703,436 to Forrest et al., incorporated herein by reference, transparent indium tin oxide (ITO) is used as the hole injecting electrode, and a Mg—Ag—ITO electrode layer is used for electron injection.

The present invention article can be employed in most OLED device configurations as an electrode, preferably as an anode, and/or any other layer. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced.

Figure 3:
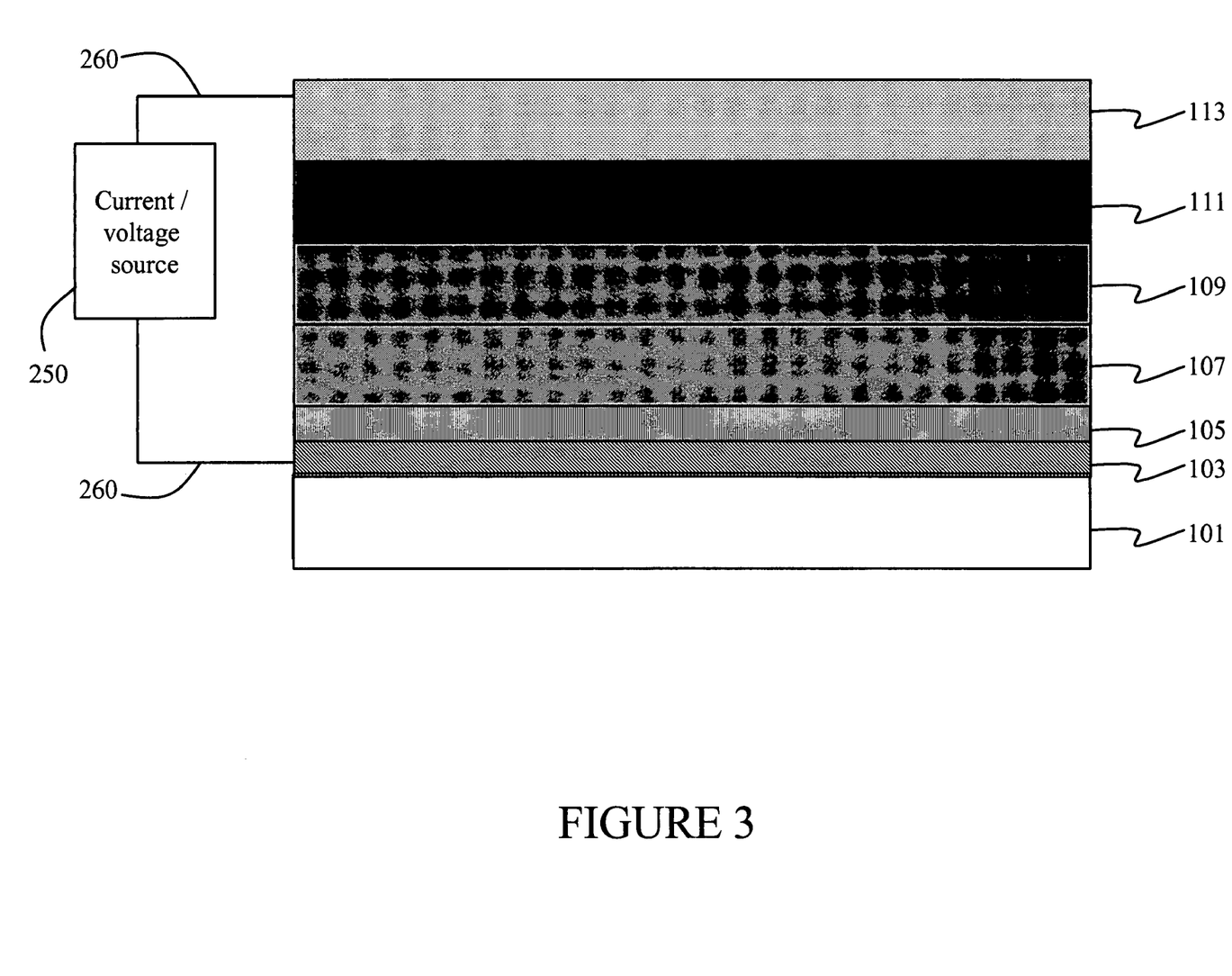
FIG. 3 shows a schematic of an OLED based display, as per the invention.

A typical structure is shown in FIG. 3 and is comprised of a substrate 101, an anode 103, a hole-injecting layer 105, a hole-transporting layer 107, a light-emitting layer 109, an electron-transporting layer 111, and a cathode 113. These layers are described in more detail below. Note that the substrate may alternatively be located adjacent to the cathode, or the substrate may actually constitute the anode or cathode. The organic layers between the anode and cathode are conveniently referred to as the organic electroluminescent (EL) element. The total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

When EL emission is viewed through anode 103, the anode should be transparent or substantially transparent to the emission of interest. Thus, the layer of this invention with its high visual light transmission is critical for such OLED display devices. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are generally immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

The electrically imageable material may also be a printable, conductive ink having an arrangement of particles or microscopic containers or microcapsules. Each microcapsule contains an electrophoretic composition of a fluid, such as a dielectric or emulsion fluid, and a suspension of colored or charged particles or colloidal material. The diameter of the microcapsules typically ranges from about 30 to about 300 microns. According to one practice, the particles visually contrast with the dielectric fluid. According to another example, the electrically modulated material may include rotatable balls that can rotate to expose a different colored surface area, and which can migrate between a forward viewing position and/or a rear nonviewing position, such as gyricon. Specifically, gyricon is a material comprised of twisting rotating elements contained in liquid filled spherical cavities and embedded in an elastomer medium. The rotating elements may be made to exhibit changes in optical properties by the imposition of an external electric field. Upon application of an electric field of a given polarity, one segment of a rotating element rotates toward, and is visible by an observer of the display. Application of an electric field of opposite polarity, causes the element to rotate and expose a second, different segment to the observer. A gyricon display maintains a given configuration until an electric field is actively applied to the display assembly. Gyricon particles typically have a diameter of about 100 microns. Gyricon materials are disclosed in U.S. Pat. No. 6,147,791, U.S. Pat. No. 4,126,854 and U.S. Pat. No. 6,055,091, the contents of which are herein incorporated by reference.

According to one practice, the microcapsules may be filled with electrically charged white particles in a black or colored dye. Examples of electrically modulated material and methods of fabricating assemblies capable of controlling or effecting the orientation of the ink suitable for use with the present invention are set forth in International Patent Application Publication Number WO 98/41899, International Patent Application Publication Number WO 98/19208, International Patent Application Publication Number WO 98/03896, and International Patent Application Publication Number WO 98/41898, the contents of which are herein incorporated by reference.

The electrically imageable material may also include material disclosed in U.S. Pat. No. 6,025,896, the contents of which are incorporated herein by reference. This material comprises charged particles in a liquid dispersion medium encapsulated in a large number of microcapsules. The charged particles can have different types of color and charge polarity. For example white positively charged particles can be employed along with black negatively charged particles. The described microcapsules are disposed between a pair of electrodes, such that a desired image is formed and displayed by the material by varying the dispersion state of the charged particles. The dispersion state of the charged particles is varied through a controlled electric field applied to the electrically modulated material. According to a preferred embodiment, the particle diameters of the microcapsules are between about 5 microns and about 200 microns, and the particle diameters of the charged particles are between about one-thousandth and one-fifth the size of the particle diameters of the microcapsules.

Further, the electrically imageable material may include a thermochromic material. A thermochromic material is capable of changing its state alternately between transparent and opaque upon the application of heat. In this manner, a thermochromic imaging material develops images through the application of heat at specific pixel locations in order to form an image. The thermochromic imaging material retains a particular image until heat is again applied to the material. Since the rewritable material is transparent, UV fluorescent printings, designs and patterns underneath can be seen through.

The electrically imageable material may also include surface stabilized ferroelectric liquid crystals (SSFLC). Surface stabilized ferroelectric liquid crystals confining ferroelectric liquid crystal material between closely spaced glass plates to suppress the natural helix configuration of the crystals. The cells switch rapidly between two optically distinct, stable states simply by alternating the sign of an applied electric field.

Magnetic particles suspended in an emulsion comprise an additional imaging material suitable for use with the present invention. Application of a magnetic force alters pixels formed with the magnetic particles in order to create, update or change human and/or machine readable indicia. Those skilled in the art will recognize that a variety of bistable nonvolatile imaging materials are available and may be implemented in the present invention.

The electrically imageable material may also be configured as a single color, such as black, white or clear, and may be fluorescent, iridescent, bioluminescent, incandescent, ultraviolet, infrared, or may include a wavelength specific radiation absorbing or emitting material. There may be multiple layers of electrically imageable material. Different layers or regions of the electrically imageable material display material may have different properties or colors. Moreover, the characteristics of the various layers may be different from each other. For example, one layer can be used to view or display information in the visible light range, while a second layer responds to or emits ultraviolet light. The nonvisible layers may alternatively be constructed of non-electrically modulated material based materials that have the previously listed radiation absorbing or emitting characteristics. The electrically imageable material employed in connection with the present invention preferably has the characteristic that it does not require power to maintain display of indicia.

Another application of the conductive layer of the invention is envisioned for touch screens. Touch screens are widely used in conventional CRTs and in flat-panel display devices in computers and in particular with portable computers. The present invention can be applied as a transparent conductive member in any of the touch screens known in the art, including but not limited to those disclosed in U.S. Pat. Appl. Pub. 2003/0170456 A1; 2003/0170492 A1; U.S. Pat. No. 5,738,934; and WO 00/39835.

Figure 4:
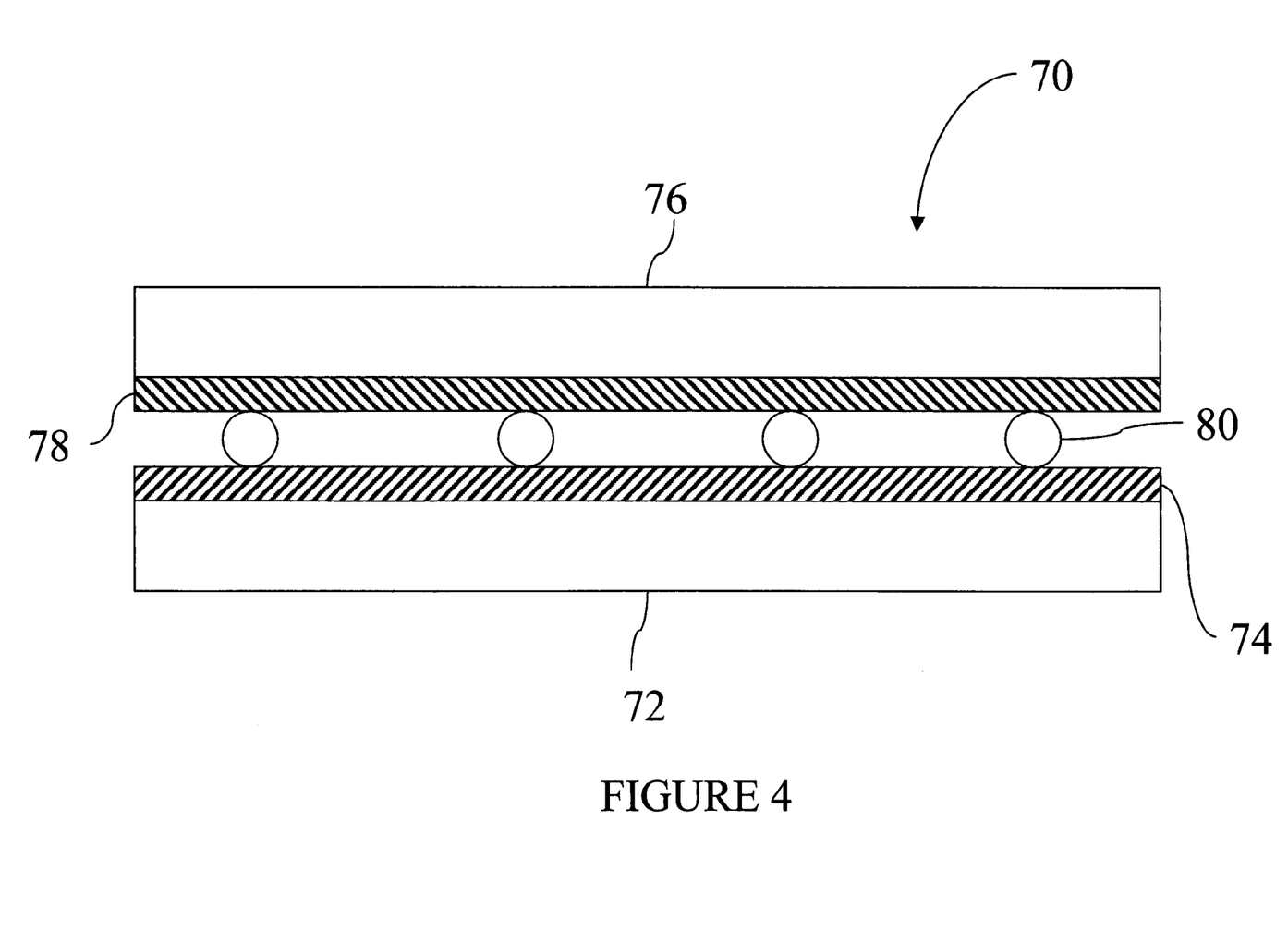
FIG. 4 shows a schematic of a resistive-type touch screen, as per the invention.

FIG. 4 shows a multilayered item 70 for a typical prior art resistive-type touch screen including a transparent substrate 72, having a first conductive layer 74. A flexible transparent cover sheet 76 includes a second conductive layer 78 that is physically separated from the first conductive layer 74 by spacer elements 80. A voltage is developed across the conductive layers. The conductive layers 74 and 78 have a resistance selected to optimize power usage and position sensing accuracy. Deformation of the flexible cover sheet 76 by an external object such as a finger or stylus causes the second conductive layer 78 to make electrical contact with first conductive layer 74, thereby transferring a voltage between the conductive layers. The magnitude of this voltage is measured through connectors (not shown) connected to metal conductive patterns (not shown) formed on the edges of conductive layers 78 and 74 to locate the position of the deforming object. Any or both of the aforesaid conductive layers can be coated from the mixture of the invention.

The conventional construction of a resistive touch screen involves the sequential placement of materials upon the substrate. The substrate 72 and cover sheet 76 are first cleaned, then uniform conductive layers are applied to the substrate and cover sheet. It is known to use a coatable electronically conductive polymer such as polythiophene or polyaniline to provide the flexible conductive layers. See for example WO 00/39835, which shows a light transmissive substrate having a light transmissive conductive polymer coating, and U.S. Pat. No. 5,738,934 which shows a cover sheet having a conductive polymer coating. The spacer elements 80 are then applied and, finally, the flexible cover sheet 76 is attached.

The following examples illustrate the practice of this invention. They are not intended to be exhaustive of all possible variations of the invention. Parts and percentages are by weight unless otherwise indicated.

EXAMPLES

Exemplary and comparative coating compositions were prepared using the following ingredients:

(a) Baytron P HC: aqueous dispersion of electronically conductive polythiophene and polyanion, namely, poly(3,4-ethylene dioxythiophene styrene sulfonate), supplied by H.C. Starck;

(b) Olin 10G: nonionic surfactant supplied by Olin Chemicals;

(c) 1-butyl-3-methyl-imidazolium tetrafluoroborate: ionic liquid

Table 1 below provides details about the coating compositions A-E.

TABLE 1

| Coating composition | water | Baytron P HC (1.3% aqueous) | Olin 10G (10% aqueous) | Ionic liquid | Comment |
|---|---|---|---|---|---|
| A | 7.64 | 44.36 | 0.25 | 0 | comparative |
| B | 7.14 | 44.36 | 0.25 | 0.5 | invention |
| C | 6.64 | 44.36 | 0.25 | 1.0 | invention |
| D | 6.14 | 44.36 | 0.25 | 1.5 | invention |
| E | 5.64 | 44.36 | 0.25 | 2.0 | invention |

The aforementioned coating compositions were coated on 100 μm thick PET films, with an adhesion promoting subbing layer (on the subbing side), by hopper coating. The said subbing layer comprised a vinylidene chloride-acrylonitrile-acrylic acid terpolymer latex. The wet lay down for each coating was maintained at about 15 cc/m². All coatings were dried at 82° C. for 5 minutes. In this way, comparative sample Comp. A and exemplary samples Ex. B-E were created.

The SER of these coatings were measured by a 4-point electrical probe. Visual light transmission value T for each sample was determined from the total optical density at 530 nm, after correcting for the contributions of the uncoated substrate, by using a Model 361T X-Rite densitometer. Details about the samples are provided in Table 2.

TABLE 2

| Sample | Coating composition | SER (ohm/square) | T (%) | comments |
|---|---|---|---|---|
| Comp. A | A | 13960 | 92 | comparative |
| Ex. B | B | 2258 | 90 | invention |
| Ex. C | C | 1121 | 88 | invention |
| Ex. D | D | 899 | 91 | invention |
| Ex. E | E | 969 | 91 | invention |

It is amply clear that exemplary samples Ex. B-E coated from a mixture of electronically conductive polymer and ionic liquid, as per invention, provide much lower SER than comparative sample Comp. A, coated from a composition comprising the same electronically conductive polymer but no ionic liquid. All exemplary samples demonstrate low SER and high visual light transmission, demonstrating their suitability for application in display devices.

The invention has been described in detail with particular reference to certain preferred embodiments thereof, but it will be understood that variations and modifications can be effected within the spirit and scope of the invention.

PARTS LIST

| | |
|---|---|
| 40 | second conductive layer |
| 42 | dielectric layer |
| 44 | conductive row contacts |
| 46 | nanopigmented layer |
| 48 | light modulating liquid crystal layer |
| 50 | LCD item |
| 52 | first conductive layer |
| 54 | substrate |
| 60 | display component |
| 64 | conductive polymer layer |
| 62 | receiver substrate |
| 66 | power source |
| 68 | electric lead |
| 70 | resistive touch screen |
| 72 | substrate |
| 74 | first conductive layer |
| 76 | cover sheet |
| 78 | second conductive layer |
| 80 | spacer element |
| 101 | substrate |
| 103 | anode |
| 105 | hole-injecting layer |
| 107 | hole-transporting layer |
| 109 | light-emitting layer |
| 111 | electron-transporting layer |
| 113 | cathode |
| 250 | voltage/current source |
| 260 | electrical conductors |

The invention claimed is:

1. A mixture comprising water, an ionic liquid and a solubilized or dispersed electronically conductive polymer in its cationic form and a polyanion associated with the conductive polymer.

2. The mixture of claim 1 wherein said ionic liquid comprises 1-Butyl-3methylimidazolium tetrafluoroborate.

3. The mixture of claim 1 wherein said ionic liquid comprises a cation selected from the group consisting of mono, di and tri-substituted imidazoliums, pyridiniums, pyrrolidiniums, phosphoniums, ammoniums, guanidiniums, and isouroniums.

4. The mixture of claim 3 wherein said ionic liquid comprises an anion selected from the group consisting of halogenides, sulfates, sulfonates, amides, imides, methanes, borates, phosphates and antimonates, cobalt tetracarbonyl, trifluoroacetate, and decanoate.

5. The mixture of claim 1 wherein said electronically conductive polymer to said ionic liquid weight ratio is between 2:98 and 20:80.

6. The mixture of claim 1 wherein said electronically conductive polymer to said ionic liquid weight ratio is between 5:95 and 50:50.

7. The mixture of claim 1 further comprising surfactant.

8. The mixture of claim 1 further comprising a film forming binder.

9. The mixture of claim 1 wherein said electronically conductive polymer comprises polythiophene.

10. The mixture of claim 1 wherein said electronically conductive polymer comprises poly(3,4-ethylene dioxythiophene styrene sulfonate).

11. The mixture of claim 1 wherein said electronically conductive polymer is selected from the group consisting of substituted or unsubstituted pyrrole-containing polymers, substituted or unsubstituted thiophene-containing polymers and substituted or unsubstituted aniline-containing polymers.

12. The mixture of claim 1 wherein said mixture is substantially free of inorganic particles larger than 1 µm.

13. The mixture of claim 1 further comprising water in an amount greater than 50 percent.

14. The mixture of claim 13 wherein water is present in an amount between 90 and 95 percent.

15. A method of forming an article comprising providing an ionic liquid, providing electronically conductive polymer in its cationic form and a polyanion associated with the conductive polymer, mixing said ionic liquid and electronically conductive polymer in a solvent to form a coating composition, coating said composition to form a film, and drying said film, wherein said solvent comprises water, said electronically conductive polymer is solubilized or dispersed in the coating composition, and the coating composition comprises a mixture according to claim 1.

16. The method of claim 15 further comprising recovering the dry conductive film.

17. The method of claim 15 wherein said article comprises an antistat layer.

18. The method of claim 15 wherein coating takes place at a temperature of between 20° C. and 50° C.

19. The method of claim 15 where drying is carried out at a temperature of between 20° C. and 150° C.

20. The method of claim 15 wherein said ionic liquid comprises a cation selected from the group consisting of mono, di and tri-substituted imidazoliums, pyridiniums, pyrrolidiniums, phosphoniums, ammoniums, guanidiniums, and isouroniums.

21. The method of claim 20 wherein said ionic liquid comprises an anion selected from the group consisting of halogenides, sulfates, sulfonates, amides, imides, methanes, borates, phosphates and antimonates, cobalt tetracarbonyl, trifluoroacetate, and decanoate.

22. The method of claim 15 wherein said electronically conductive polymer to said ionic liquid weight ratio is between 2:98 and 20:80.

23. The method of claim 15 wherein said electronically conductive polymer to said ionic liquid weight ratio is between 5:95 and 50:50.

24. The method of claim 15 wherein the coating composition further comprises a surfactant.

25. The method of claim 15 wherein the coating composition further comprises a film forming binder.

26. The method of claim 15 wherein said electronically conductive polymer comprises polythiophene.

27. The method of claim 15 wherein said electronically conductive polymer comprises poly(3,4-ethylene dioxythiophene styrene sulfonate).

28. The method of claim 15 wherein said electronically conductive polymer is selected from the group consisting of substituted or unsubstituted pyrrole-containing polymers, substituted or unsubstituted thiophene-containing polymers and substituted or unsubstituted aniline-containing polymers.

29. The method of claim 15 wherein said article has a surface electrical resistivity of less than 5000 ohm/sq.

30. The method of claim 15 wherein said article has a visible light transmission of greater than 80 percent.

31. The method of claim 15 wherein said article has a surface electrical resistivity of less than 5000 ohm/sq and a visible light transmission of greater than 80 percent.

* * * * *